United States Patent
Khu

(10) Patent No.: US 7,071,848 B1
(45) Date of Patent: *Jul. 4, 2006

(54) HARDWARE-FRIENDLY GENERAL PURPOSE DATA COMPRESSION/DECOMPRESSION ALGORITHM

(75) Inventor: Arthur H. Khu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/847,967

(22) Filed: May 18, 2004

Related U.S. Application Data

(63) Continuation of application No. 10/175,710, filed on Jun. 19, 2002, now Pat. No. 6,744,388.

(51) Int. Cl.
*H03M 7/38* (2006.01)

(52) U.S. Cl. ................ 341/51; 382/232; 382/236; 341/50

(58) Field of Classification Search .......... 341/50, 341/51, 55; 710/68; 360/8; 382/232, 282, 382/236

See application file for complete search history.

(56) References Cited

U.S. PATENT DOCUMENTS

| | | | |
|---|---|---|---|
| 4,906,991 A * | 3/1990 | Fiala et al. | |
| 5,237,460 A | 8/1993 | Miller et al. | |
| 5,371,499 A * | 12/1994 | Graybill et al. | |
| 5,414,425 A * | 5/1995 | Whiting et al. | |
| 5,608,396 A * | 3/1997 | Cheng et al. | |
| 5,729,223 A | 3/1998 | Trissel | |
| 5,798,718 A * | 8/1998 | Hadady | |
| 5,974,180 A * | 10/1999 | Schwendeman | 382/232 |
| 6,446,145 B1 | 9/2002 | Har et al. | |
| 6,571,016 B1 * | 5/2003 | Mehrotra et al. | 382/236 |
| 6,671,420 B1 * | 12/2003 | Feather et al. | 382/282 |
| 6,737,992 B1 * | 5/2004 | Wolthuis | 341/55 |

* cited by examiner

*Primary Examiner*—Jean Bruner Jeanglaude
(74) *Attorney, Agent, or Firm*—LeRoy D. Maunu

(57) ABSTRACT

Methods and systems are provided for dynamically compressing and decompressing a data stream in a manner that facilitates hardware implementation. In one aspect, a compression system identifies literal data sequences of variable length in the data stream and characterizes each literal sequence with an indicator that is inserted into the data stream. Sequences that repeat previous sequences in the data stream are identified and replaced with codes characterizing the repeating sequence. Another aspect provides a decompression method and system for removing indicators inserted by the compression system and replacing codes in the data stream with the repeating sequences characterized by the codes.

13 Claims, 8 Drawing Sheets

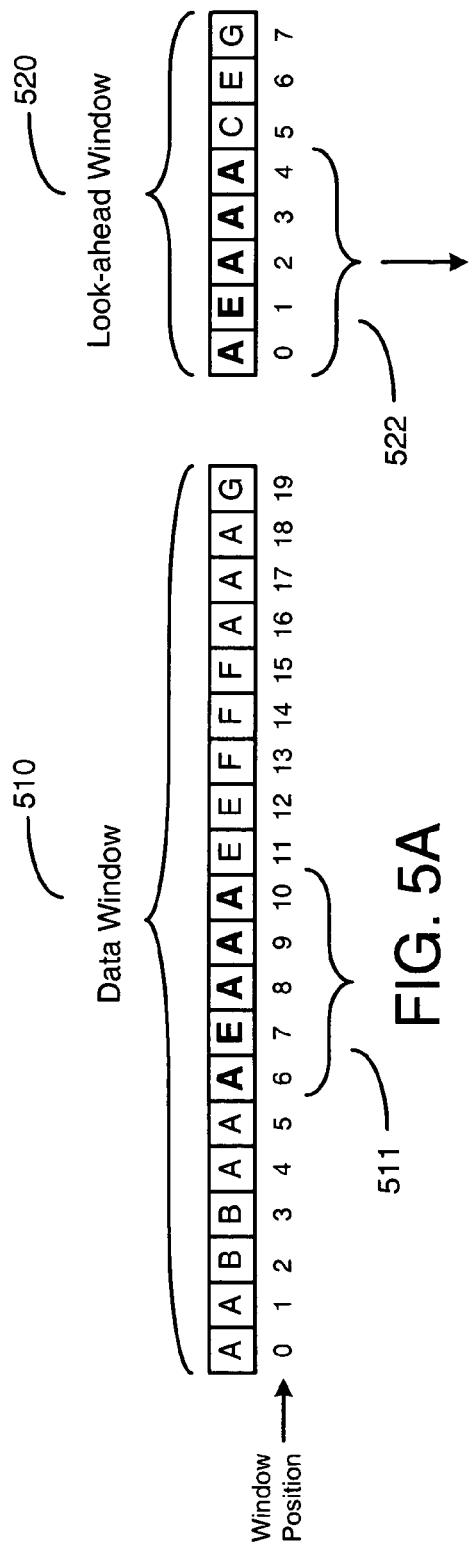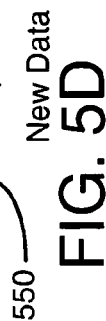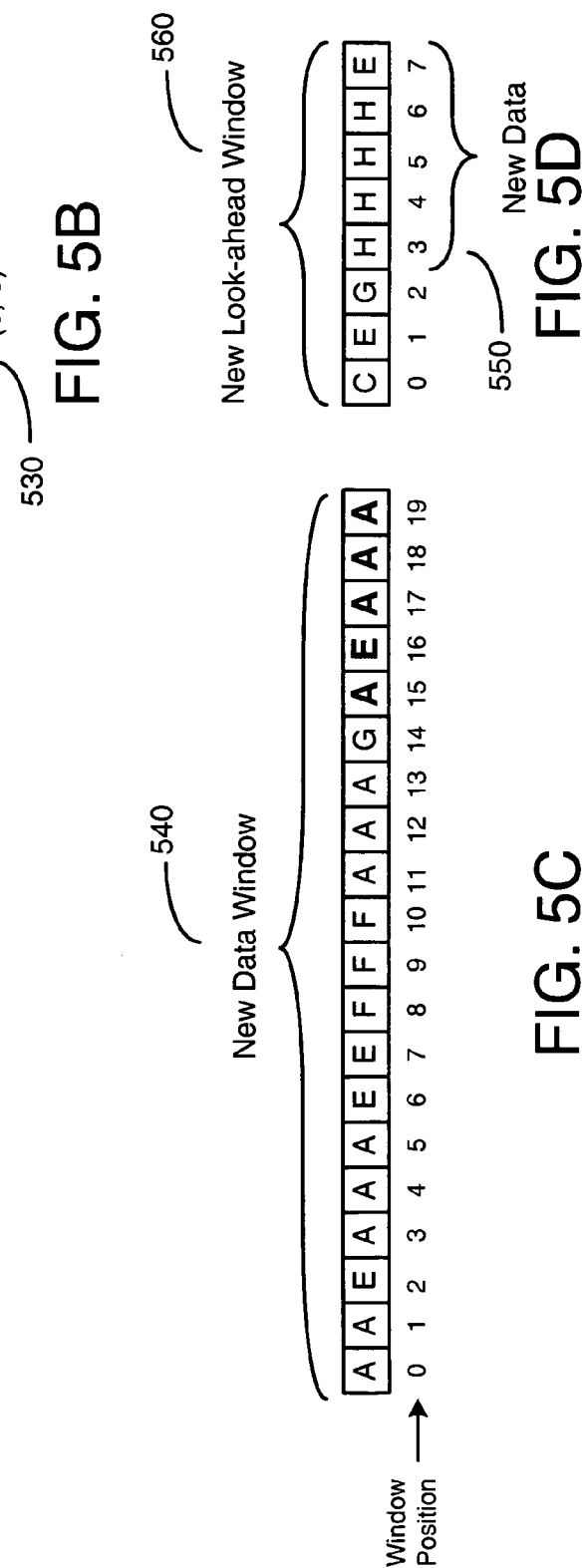

HARDWARE-FRIENDLY GENERAL PURPOSE DATA COMPRESSION/DECOMPRESSION ALGORITHM

This application is a continuation of Ser. No. 10/175,710, now U.S. Pat. No. 6,744,388.

FIELD OF THE INVENTION

The present invention generally relates to compressing and decompressing a data stream, and more particularly to a method for compressing and decompressing a data stream that is more easily implemented in hardware.

BACKGROUND

Data compression and decompression techniques remove redundancy in a data stream to provide more efficient utilization of memory and communication channel resources. Lossless compression methods are used for data streams that require the original data to be exactly reconstructed from the compressed data stream without any loss of information. One category of lossless compression algorithms, generally termed LZ compression, relies on substitution of a code for a frequently repeating data pattern.

One group of LZ compression algorithms dynamically creates a table of frequently encountered data patterns as the data stream is compressed. Code sequences indicating the location in the table of the frequently encountered data patterns are generated and embedded in the data stream. The table is added by the compression system as part of the compressed data stream for use by the decompression system to decompress the compressed data stream.

Another group of LZ compression algorithms does not add a table of frequently repeated sequences to the data stream. Instead, the decompression system dynamically recreates the repeating data patterns by copying a specified number of data units starting from a buffer location specified by codes embedded in the compressed data stream.

Both groups of LZ compression algorithms send uncompressed literal data that is not part of a repeating pattern from the compression system to the decompression system. A data type flag is typically incorporated into the data stream to indicate whether a particular data unit is code or literal data, resulting in a non-integral data unit size. In compression systems using a byte as the data unit, a data type flag must be added to each data byte by the compression system, resulting in each data byte represented by 9 bits, including 8 bits of data and the data type flag. The decompression system for this compressed data stream must strip out the data type flag and repack the data stream into bytes to reconstruct the original data.

SUMMARY OF THE INVENTION

In various embodiments, a method and apparatus are provided for compressing and decompressing a data stream in a manner that is more easily implemented in hardware.

One aspect of the present invention provides a method and system for replacing repeating sequences in the data stream with codes. The codes characterize a repeating sequence by indicating the location and length of an identical sequence in the data stream. Indicators are inserted into the data stream characterizing the length of non-repeating sequences of data.

In another aspect of the invention, a decompression method and system are provided. The decompression method and system removes the indicators inserted by the compression system from the data stream, each indicator characterizes a non-repeating sequence of variable length. Codes inserted into the data stream by the compression system are replaced with the repeating sequences characterized by the codes.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which:

FIG. 5A illustrates a literal data sequence in a data window of a data stream;

FIG. 5B illustrates a repeating sequence in a look-ahead window of the data stream found in the data window;

FIG. 5C illustrates a data window after a repeating sequence is encoded in accordance with an embodiment of the invention;

FIG. 5D illustrates a look-ahead window after new data is added to replace a repeating sequence encoded in accordance with an embodiment of the invention;

DETAILED DESCRIPTION

Various embodiments of the present invention are described in terms of compressing and decompressing a data stream in a manner that facilitates hardware implementation. The present invention provides a compression method and system, and an associated decompression method and system. The compression and decompression methods and systems provided by the invention may be advantageously used for more efficient data storage and/or transmission.

The present invention is believed to be applicable to a variety of processes and systems within the technology areas of data communication and storage. The invention is believed to be particularly beneficial for configuring programmable logic devices. Configuration data for complex programmable logic devices (CPLDs) and field programmable gate arrays (FPGAs) can be compressed and stored in less expensive, lower density storage devices.

Previous compression/decompression techniques use a flag bit to identify each data unit (e.g., a byte) as either a code data unit or a literal data unit. By previous techniques, the compression system inserts a data type flag into the data stream to identify the data type for each data unit. Adding type flags forces the compression system to take bits from the following code or literal data units to incorporate the type flag to make a whole data unit. The remaining bits are added to bits from the next data unit to form a byte, and so on. The decompression system is required to strip out the flags and reassemble the data into integral data units (e.g., bytes). These techniques require circuitry in the compression system to insert the flag bits and form data units, and also circuitry in the decompression system to remove the flag bits and regenerate the data units.

The present invention provides methods of compression and decompression allowing the data to be manipulated by bytes, or by any other logical data unit (e.g., words), thereby simplifying hardware implementation relative to previous techniques. Additionally, the present invention identifies compressed data sequences using an actual buffer or FIFO address rather than a logical address, further reducing the required hardware.

Those skilled in the art will appreciate that the invention may be used in a wide variety of technology areas to conserve memory space and/or make more efficient use of communication channel capacity. The invention may be applied to a variety of programmable devices and adapted to a number of applications to increase the effective memory storage in a programmable device or to enhance communication bandwidth.

Figure 1:
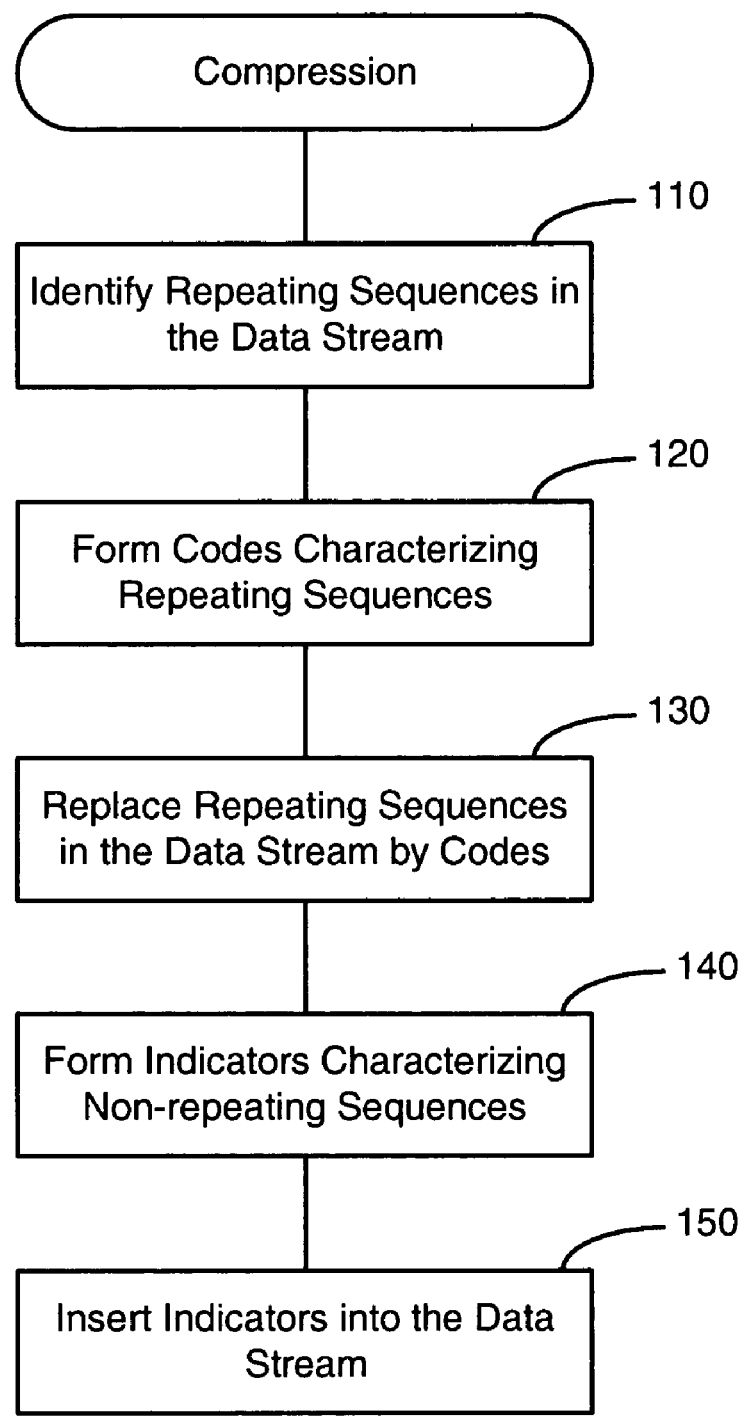
FIG. 1 is a diagram conceptually illustrating a method for compressing a data stream in accordance with an embodiment of the invention.

FIG. 1 is a diagram conceptually illustrating, in broad and general terms, a compression method of an embodiment of the present invention. Although the blocks of the diagram are presented in a particular order, it is not necessary to perform the operations described in the blocks in the particular order presented in FIG. 1. Furthermore, some operations may be performed simultaneously.

Repeating sequences in a data stream are identified 110. The repeating sequences are characterized by codes indicating the length of the repeating sequence and the location of an identical sequence in the data stream 120. The repeating sequences are replaced in the data stream by the codes 130. Non-repeating sequences are characterized using indicators 140 providing the length the non-repeating sequences. The indicators characterizing the non-repeating sequences are inserted into the data stream 150.

Figure 2:
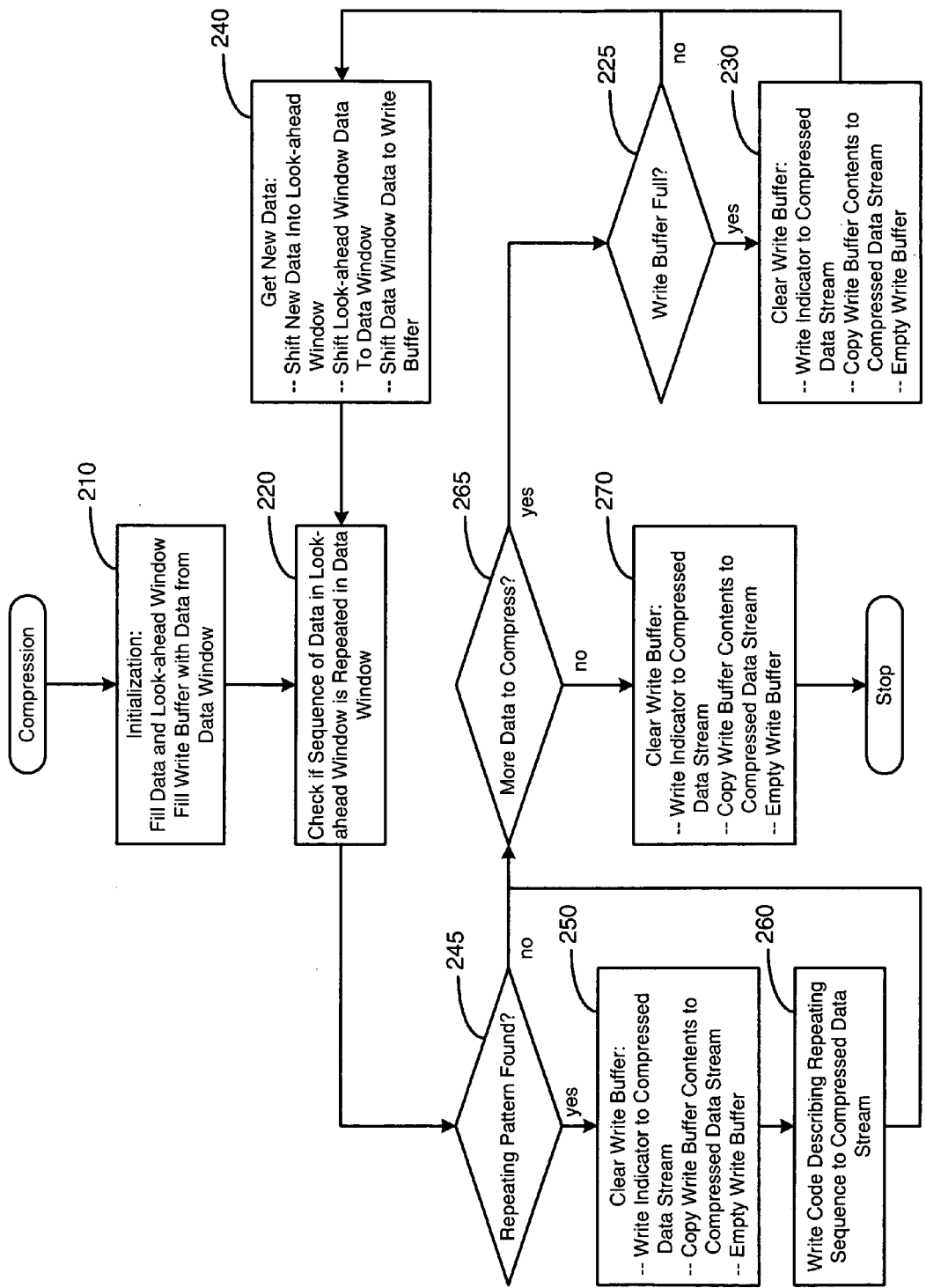
FIG. 2 is a flowchart illustrating a method for compressing a data stream in accordance with an embodiment of the invention.

FIG. 2 is a more detailed flowchart illustrating a compression method of the present invention. Although the blocks of the diagram are presented in a particular order, it is not necessary to perform the operations described in the blocks in the particular order presented in FIG. 2. Furthermore, some operations may be performed simultaneously.

The compression method is implemented using two sliding windows to hold the data stream or data block to be compressed. The two sliding windows are implemented, for example, as memory buffers, or as first-in-first-out (FIFO) registers. The first sliding window is denoted the data window and the second sliding window is denoted the look-ahead window. Additionally, a write buffer may be used as a temporary data storage buffer.

The two sliding windows and the write buffer are initialized 210. The initialization may include filling the data and look-ahead windows with data from the data stream and filling the write buffer with data from the data window. Data in the look-ahead window is compared to data in the data window. Sequences in the look-ahead window that repeat an identical sequence in the data window are identified 220. The repeating sequence may be required to have a minimum length, such as 3 bytes. Furthermore, it may be required that the length and location of the repeating sequence can be defined by a predetermined number of data units, for example, 2 bytes.

If a repeating sequence is found 245, the look-ahead window contains a sequence that repeats a sequence in the data window. The write buffer is cleared 250. Clearing the write buffer requires writing an indicator describing the number of data units in the write buffer to the compressed data stream. These data units are considered a non-repeating sequence. The indicator containing the non-repeating sequence length is described in whole data units. For example, an 8-bit byte can have the most significant bit set to 0 to indicate that a literal sequence is being defined, and the lower 7 bits used to specify the length of the data literal sequence. The contents of the write buffer are copied to the compressed data stream and the write buffer is emptied.

A code characterizing the repeating sequence in the look-ahead window is written to the compressed data stream 260. The code includes 1) a code flag indicating a repeating data sequence has been compressed, 2) an address in the data window where the repeating sequence may be located, and 3) the length of the repeating sequence. The repeating sequence is replaced in the data stream by the code. The code is represented in whole data units. For example, two 8-bit bytes can be used to represent the compressed data code: the most significant bit of the first byte can be set to 1 to indicate that a repeating data sequence has been found; the remaining 7 bits to indicate the length of the repeating sequence, and the next byte to indicate the position of the repeating data sequence within the data window.

If a repeating sequence is not found 245, and there is still more data to compress 265, the write buffer is checked to determine if the write buffer is full 225. If the write buffer is not full 225, new data is shifted into the look-ahead window, the look-ahead data is shifted into the data window and the write buffer is filled with data from the data window 240. If the write buffer is full, the write buffer is cleared 230 as described above.

The process described in blocks 210–265 continues until there is no more data to compress 265. If there is no more data to compress 265, the write buffer is cleared 270 and the process is complete.

Figure 3:
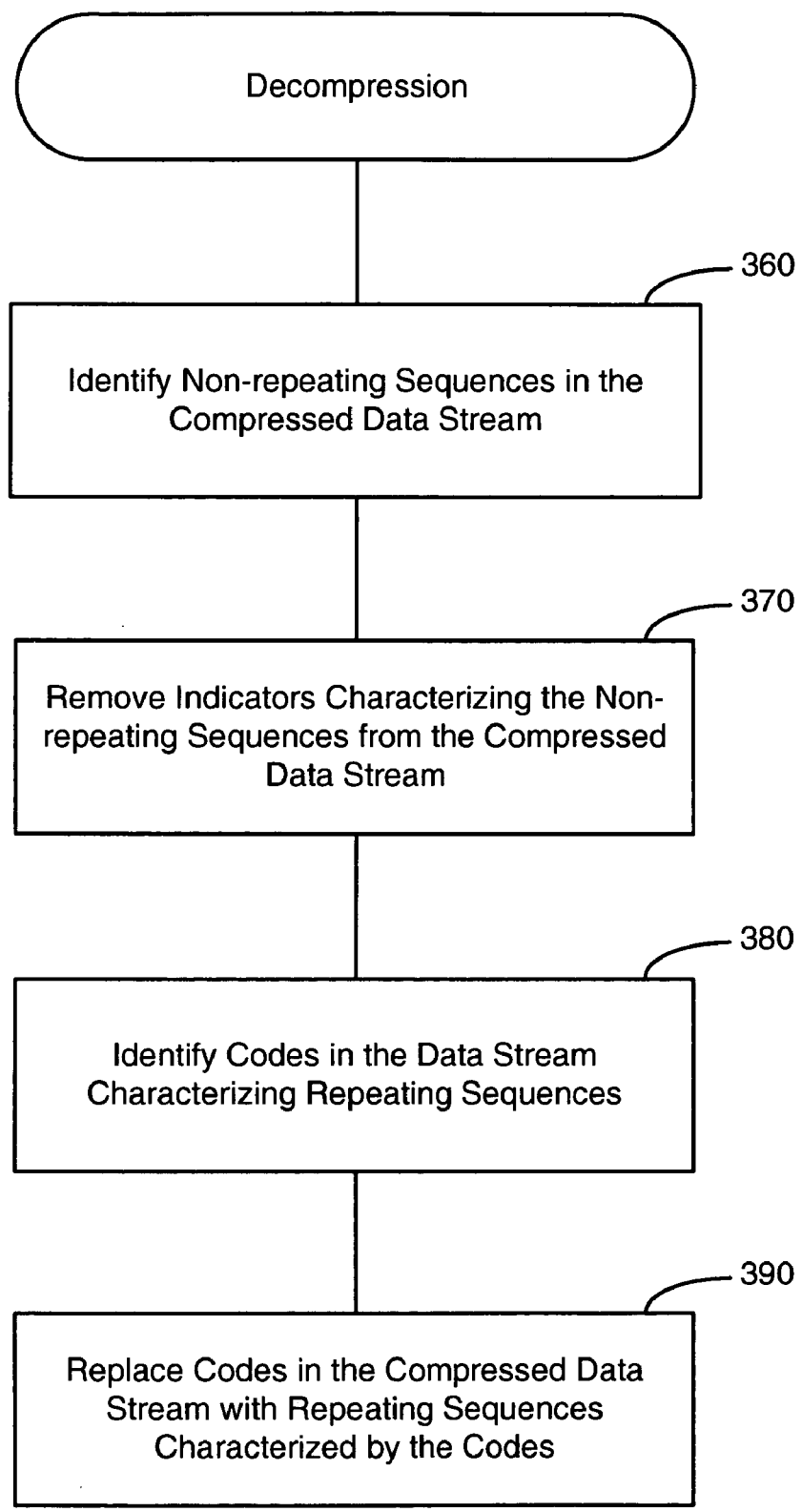
FIG. 3 is a diagram conceptually illustrating a method for decompressing a data stream in accordance with an embodiment of the invention.

A decompression method in accordance with an embodiment of the invention is conceptually illustrated, in broad and general terms, in the diagram of FIG. 3. A data stream compressed by the method discussed above may be dynamically decompressed. Non-repeating sequences in the data stream are identified 360 by indicators inserted in the data stream by the compression method discussed above. The indicators characterizing the non-repeating sequences are removed from the compressed data stream 370. Codes characterizing repeating sequences are identified in the compressed data stream 380. The codes are replaced with the repeating sequences characterized by the codes 390.

Figure 4:
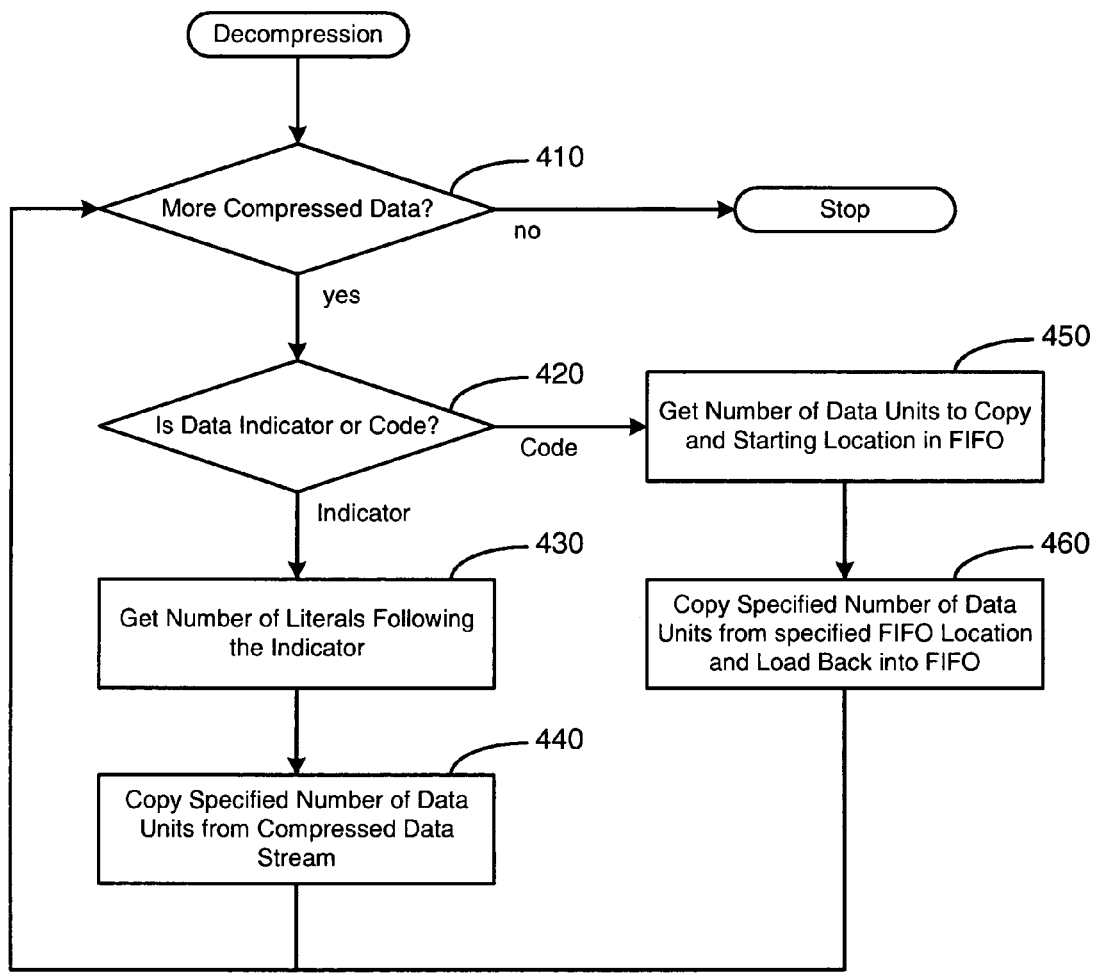
FIG. 4 is a flowchart illustrating a method for decompressing a data stream in accordance with an embodiment of the invention.

FIG. 4 is a more detailed flowchart illustrating a decompression method of the invention. The first data unit of the compressed data stream transferred to the decompression system is either an indicator or code 420. If the data unit is an indicator, then the length of the literal sequence is extracted from the indicator 430 and the specified number of literals is loaded from the compressed data stream into a sliding window or FIFO 440.

If the data unit is code, then the sequence length and sliding window location of the repeating data sequence are extracted from the code units 450. The decompressor replaces the codes by copying the specified number of data units starting from the specified sliding window location to the sliding window 460. After reading the specified number of literals from the compressed data stream or copying the specified number of data units from the sliding window, the next data unit is checked to determine if the next data unit is an indicator or a code. The process defined by blocks 420–460 is repeated until there is no more compressed data 410 and the process ends.

Every data unit loaded into the decompressor sliding window is decompressed data. The decompressed data does not have to be repacked into data units because indicators and code bytes were inserted as whole data units.

An example of the compression process of the present invention is illustrated in FIGS. 5A–5D. In this example, the data and look-ahead windows are represented with lengths of 20 bytes and 8 bytes, respectively, although other window lengths may be used. Furthermore, although an 8-bit byte is used as a data unit in this example, the data unit may be chosen to be any convenient length.

FIG. 5A illustrates the state of a 20-byte sliding data window 510 at a first moment in time, $t_1$. The data window 510 contains the literal sequence AABBAAAEAAAEEFF-FAAAG. An 8-byte look-ahead window 520 at time $t_1$ is illustrated in FIG. 5B. The data window 510 is searched for a sequence of minimum length, for example, 3 bytes, that is repeated by a sequence in the look-ahead window 520 beginning with the character A located in look-ahead position 0.

In this example, a 5-byte sequence, AEAAA 522, located in the look-ahead window 520 at look-ahead window positions 0–4 repeats a sequence 511 in the data window located at data window positions 6–10. The sequence AEAAA 522 in the look-ahead window 520 represents a repeating sequence that may be encoded using a two byte code including the location and the length of the repeating sequence. In this example, the repeating sequence may be characterized by the n-tuple (6,5) 530, where 6 represents the location of the repeating sequence in the data window, and 5 indicates the length of the repeating sequence.

FIG. 5C illustrates the state of the data window 540 at a second moment in time, $t_2$. After the repeating sequence AEAAA has been identified and encoded by the process described above, 5 bytes from the look-ahead window are shifted into the data window. FIG. 5D illustrates the condition of the look-ahead window at time $t_2$. Five bytes of new data, HHHHE 550, have been shifted into the look-ahead window 560, as illustrated in FIG. 5D, and the process of examining the data window 540 for a repeating sequence beginning at look-ahead window 560 position 0 is continued.

Figure 6:
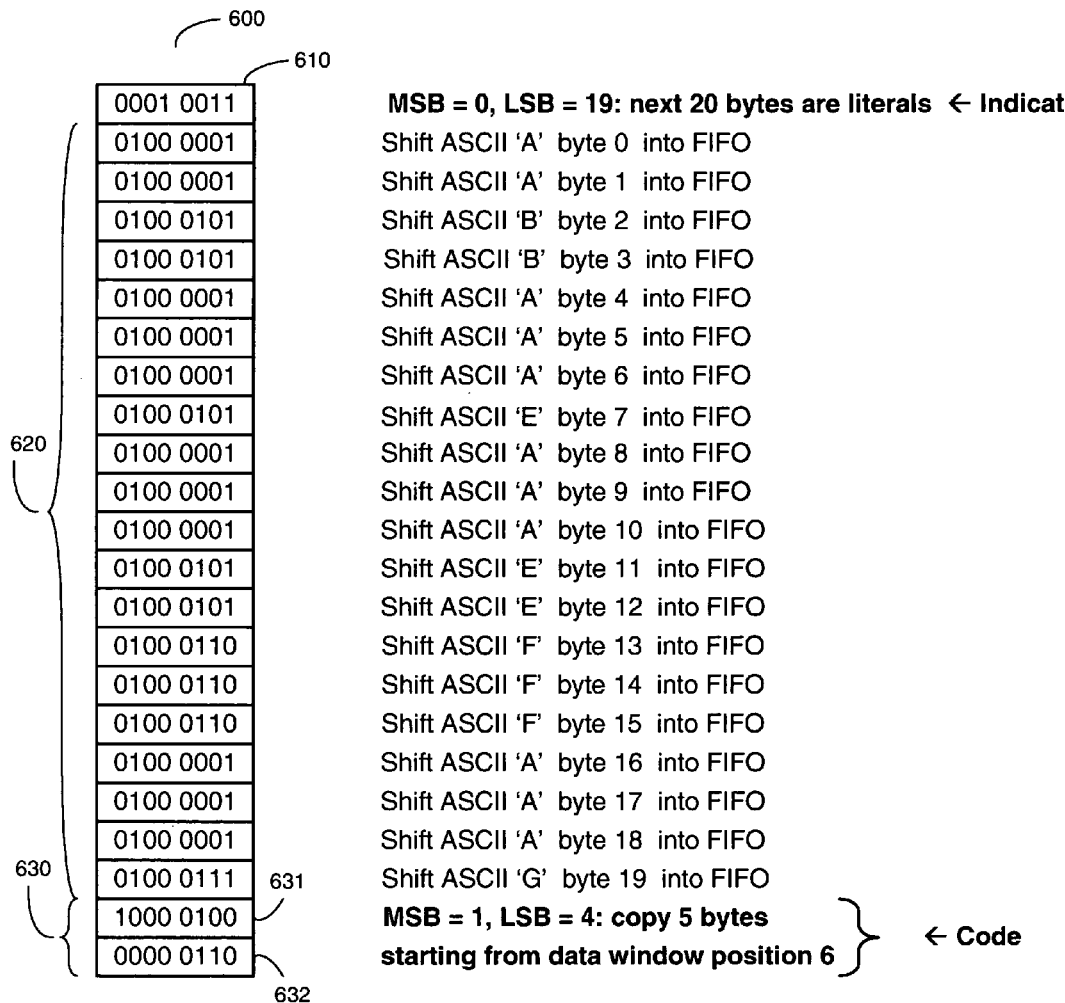
FIG. 6 illustrates a compressed data stream in accordance with an embodiment of the invention.
Figure 7A:
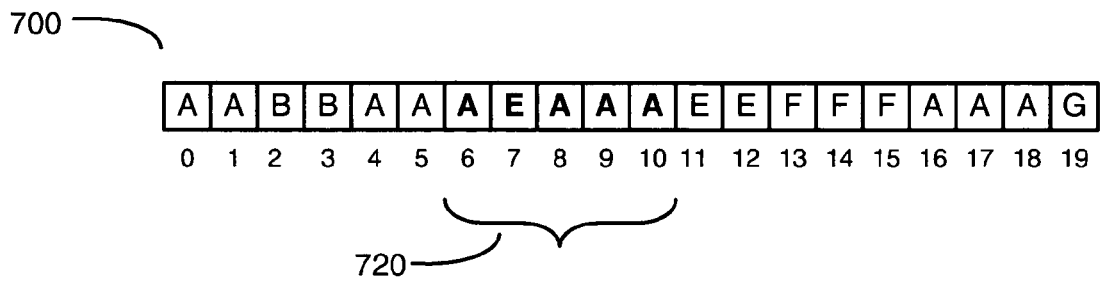
FIGS. 7A and 7B illustrate a decompressed data stream in accordance with an embodiment of the invention.
Figure 7B:
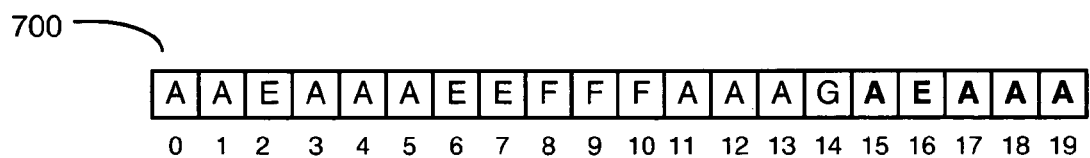

An example of decompression in accordance with an embodiment of the invention is illustrated by a compressed data stream in FIG. 6 and a decompression FIFO in FIGS. 7A and 7B. The decompression example is based on the compressed data example discussed in the preceding paragraphs. During decompression, the decompression system interprets the indicators and codes inserted into the data stream by the compression system. In this example, the data stream is decompressed by interpreting the indicators and codes in the data stream and shifting the decompressed data into a FIFO 700, illustrated in FIG. 7A. The length of the FIFO used for decompression must be greater than or equal to the length of the FIFO used for compression.

Turning again to FIG. 6, the MSB of the first byte in the data stream 610 indicates whether the byte is an indicator for a non-repeating sequence or a code for a repeating sequence. In this case, a 0 in the MSB of the byte 610 identifies the byte as a non-repeating data sequence indicator. The 7 LSBs of the indicator byte 610 represent the length of the non-repeating data sequence 620 following the indicator. In this example, the 7 LSBs of the indicator byte 610 contain 0010011, decimal 19, to which 1 is added in one implementation to get decimal 20, indicating that the literal sequence 620 following the indicator byte 610 is 20 bytes in length. The indicator byte 610 is removed from the data stream by the decompression system and the 20 byte literal sequence 620 is shifted into a decompression FIFO 700 illustrated in FIG. 7.

After the 20 byte literal sequence 620 is shifted into the decompression FIFO, the next byte 631 is processed. The MSB of byte 631 is a 1, which identifies this as the first byte of a two-byte code 630. The code characterizes a repeating sequence that may be identified by a length and a location of an identical sequence in the FIFO.

The length of the repeating sequence characterized by the code 630 is contained in the 7 LSBs of the first code byte 631. The location of the repeating sequence in the FIFO is contained in the 8 bits of the second code byte 632.

In this example, the 7 LSBs of the first code byte 631 contains 000100, decimal 4 to which 1 is added in one implementation to get decimal 5, indicating that the repeating sequence is 5 bytes in length. The 8 bits of the second code byte 632 identify the location of the repeating sequence in the decompression FIFO 700 illustrated in FIG. 7A. The second code byte 632 contains 00000110, decimal 6, indicating the first location of the repeating sequence is the sixth position 720 of the FIFO 700 illustrated in FIG. 7A. The 5-byte sequence AEAAA, contained in the FIFO 700 beginning with the sixth position 720 of the FIFO 700 and extending for five bytes, is shifted into the decompression FIFO.

FIG. 7B illustrates the 20-byte decompression FIFO 700 following the operations described above. The first 5 bytes in the buffer fall out of the FIFO as the 5-byte sequence is shifted into the FIFO.

Figure 8A:
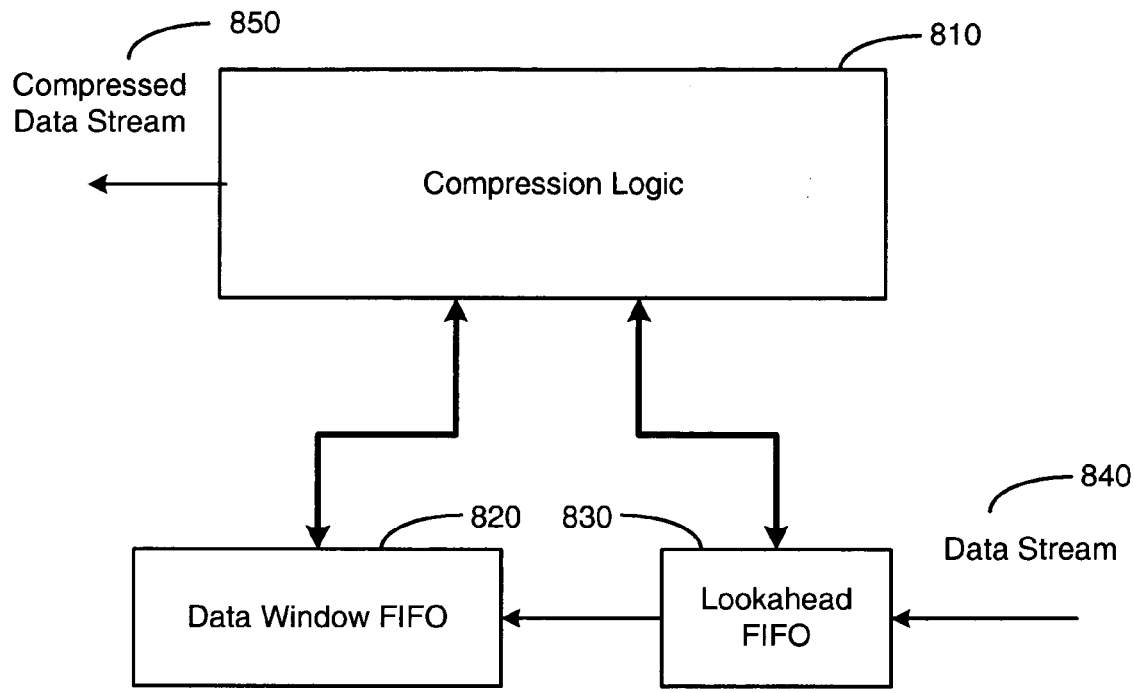
FIG. 8A is a block diagram of a system for compressing a data stream in accordance with an embodiment of the invention.

A block diagram of a system for compressing a data stream in accordance with an embodiment of the present invention is illustrated in FIG. 8A. The system includes compression logic 810 configured to control the process of compression, a data FIFO 820, and a look-ahead FIFO 830. Data from the data stream 840 is shifted through the look-ahead FIFO 830 and into the data FIFO 820. The data in the data FIFO 830 is examined for sequences that are repeated in the look-ahead FIFO 820. Repeating sequences are identified and encoded using the location of the repeating sequence in the data FIFO and the length of the repeating sequence. The codes characterizing the repeating sequences are inserted into the compressed data stream 850 in place of the repeating sequences. Data in the FIFO 820 that are not part of a repeating sequence in FIFO 830 are considered literal sequences. The indicators and literal data are inserted into the compressed data stream 850.

Figure 8B:
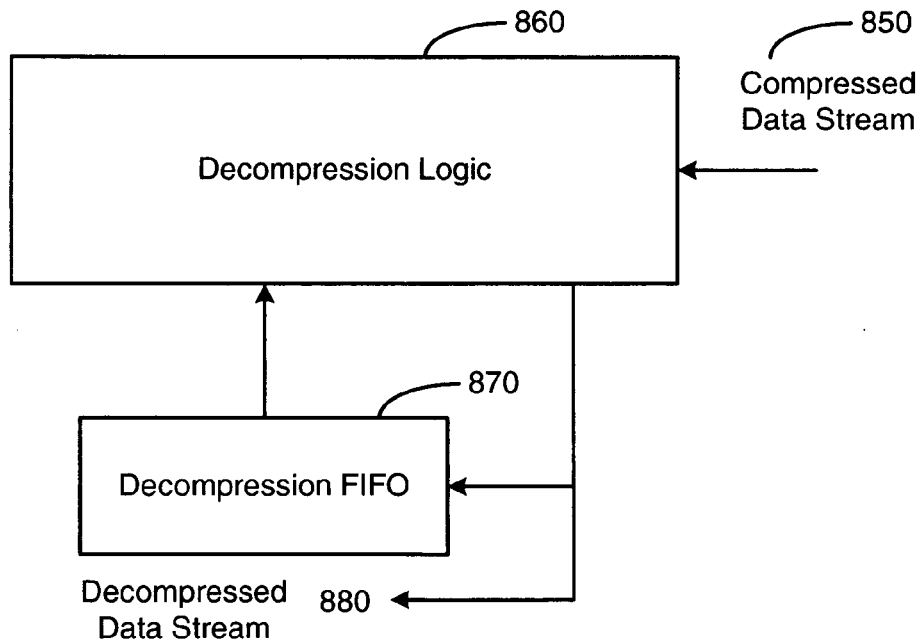
FIG. 8B is a block diagram of a system for decompressing a data stream in accordance with an embodiment of the invention.

FIG. 8B illustrates a block diagram of a system for decompressing a compressed data stream. The decompression system includes decompression logic 860, configured to control the process of decompression, and a decompression FIFO 870. The compressed data stream 850 includes indicators and codes that are detected by the decompression logic 860. The indicators are removed from the data stream and the literal sequences are shifted in to the decompression FIFO 870. Codes characterizing repeating sequences in the compressed data stream are detected and decoded by the decompression logic 860. The repeating sequences characterized by the codes are inserted in place of the codes and shifted into the decompression FIFO 870. Data shifted into the FIFO 870 is decompressed data 880.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for representing data, comprising:
   a first memory area comprising a first data sequence having a first set of logical data units;
   a second memory area comprising a second data sequence having a second set of logical data units and a third data sequence having a third set of logical data units; and
   circuitry configured to replace the third data sequence with a first indicator, when the third data sequence and the first data sequence are identical, and configured to modify the second data sequence with a second indicator, when the second data sequence and the first data sequence are different, wherein the second indicator characterizes a non-repeating sequence of variable length and comprises an indicator flag and a length of the second sequence.

2. The system of claim 1 wherein the circuitry includes programmable logic.

3. The system of claim 1 wherein the first indicator characterizes a repeating sequence.

4. The system of claim 3 wherein the first indicator comprises a code flag, a length of the third sequence, and a location of the third sequence.

5. The system of claim 1 wherein the first memory area comprises a look-ahead first-in-first-out (FIFO) memory.

6. The system of claim 1 wherein the second memory area comprises a first-in-first-out (FIFO) memory.

7. A system for decompressing a data block, comprising:
   means for recognizing a code characterizing a repeating sequence by a code flag in the code;
   means for extracting a length of the repeating sequence from the code;
   means for extracting a location of the repeating sequence from the code;
   means for replacing the code characterizing a repeating sequence with the repeating sequence;
   means for recognizing a code characterizing a non-repeating sequence by a code flag in the code;
   means for extracting a length of the non-repeating sequence from the code;
   means for removing the code characterizing a non-repeating sequences from the data block.

8. A system for compressing an input data stream, comprising:
   a first-in-first-out (FIFO) memory arrangement arranged to receive the input data stream;
   a compression circuit coupled to the FIFO arrangement, the compression circuit configured to detect each repeated sequence in the input data stream, output to a compressed data stream a code representing a repeated sequence of data in the input data stream, output to the compressed data stream non-repeating sequences of data and respective indicator values for the non-repeating sequences, wherein each indicator value signals a non-repeating sequence and specifies a number of units of data in the non-repeating sequence.

9. The system of claim 8, wherein the FIFO arrangement includes a first FIFO memory and a second FIFO memory, and the compression circuit is further configured to shift the input data stream from the second FIFO memory to the first FIFO memory, search in the first FIFO memory for sequence of data from the second FIFO memory, write data from the first FIFO to a write buffer, and output data from the write buffer.

10. The system of claim 9, wherein the compression circuit is further configured to clear the write buffer and output data from the write buffer responsive to detection of a sequence of data from the second FIFO memory in the first FIFO memory.

11. The system of claim 10, wherein the compression circuit is further configured to clear the write buffer and output data from the write buffer responsive to the write buffer being full.

12. The system of claim 11, wherein the compression circuit is further configured to output to the compressed data stream an indicator value that specifies a number of data units in the write buffer responsive to detection of a sequence of data from the second FIFO memory in the first FIFO memory.

13. The system of claim 12, wherein the compression circuit is further configured to output to the compressed data stream, following output of data from the write buffer, a code that flags a compressed sequence, specifies an address in the write buffer, and specifies a length of the sequence from the second FIFO memory detected in the first FIFO memory.

* * * * *